United States Patent [19]

Valdettaro

[11] 3,774,459

[45] Nov. 27, 1973

[54] UHF TUNING MECHANISM

[75] Inventor: Alarico A. Valdettaro, Bloomington, Ind.

[73] Assignee: Sarkes Tarzian, Inc., Bloomington, Ind.

[22] Filed: Mar. 9, 1972

[21] Appl. No.: 233,148

[52] U.S. Cl. .................. 74/10.54, 74/10.41, 74/10.8

[51] Int. Cl. ............................................ F16h 35/18

[58] Field of Search ......................... 74/10.41, 10.54, 74/10.5, 10.8, 10.15

[56] References Cited

UNITED STATES PATENTS 3,234,801 2/1966 Valdettaro et al. ................ 74/10.41

*Primary Examiner*—Milton Kaufman

*Attorney*—Richard D. Mason et al.

[57] ABSTRACT

A compact UHF tuning mechanism is provided for a continuously variable UHF tuner which has a small front panel profile and wherein the channel selector shaft is provided with a detent position for each of the seventy UHF stations. A counter-type stop mechanism which occupies a minimum amount of space ahead of the UHF tuner is provided to prevent the selector shaft from being moved beyond the ends of the UHF band.

12 Claims, 14 Drawing Figures

UHF TUNING MECHANISM

The present invention relates to UHF tuning mechanisms, and, more particularly, to UHF tuning mechanisms of the type in which a detented channel selector shaft is employed and a nonambiguous digital dial arrangement is provided to indicate which UHF station is being received.

In copending Valdettaro application Ser. No. 174,722 filed Aug. 25, 1971, there is disclosed a continuously variable UHF tuner arrangement wherein a single channel selector shaft is provided with a detent position for each of the seventy UHF television stations and a highly accurate detent mechanism is employed to return the channel selector shaft to any one of the detent positions with extreme accuracy. Said application also discloses a digital dial arrangement which is employed to indicate exactly which UHF station is being received. While the arrangement disclosed in said copending Valdettaro application is entirely satisfactory for its intended purpose, the space required for the gearing drive mechanism and the detent arrangement for the selector shaft of the tuning mechanism is in certain instances too large to be readily accommodated in television cabinets of the extremely compact variety. These television cabinets have heretofore required the use of UHF tuner drive mechanisms of the continuous drive or nondetent type, such as shown for example in Valdettaro, et al. U.S. Pat. No. 3,574,285 and Badger U.S. Pat. No. 3,446,083. While the arrangements shown in these patents provide a relatively small profile and are adpated for ease and flexibility in mounting in small television cabinets, they do not function satisfactorily with an arrangement wherein the selector shaft of the UHF tuning mechanism is detented for each one of the seventy UHF television stations.

It is, therefore, an object of the present invention to provide a new and improved UHF tuning mechanism wherein one or more of the above discussed disadvantages of prior art arrangements is eliminated.

It is another object of the present invention to provide a new and improved UHF tuning mechanism in which a highly accurate detent mechanism is employed to provide a selector shaft detent position for each of the seventy UHF television stations which is extremely compact and is adapted for front panel mounting within a small television cabinet in any one of a number of different orientations.

It is a further object of the present invention to provide a new and improved UHF tuning mechanism wherein the selector shaft is detented for each of the seventy UHF television stations and tens and units dials are provided to provide a composite UHF channel indication for each detent position, and wherein a combined drive mechanism for the tens dial and a stop mechanism for the selector shaft at each end of the UHF television band is provided.

It is another object of the present invention to provide a new and improved tuning mechanism wherein a multiturn counter stop mechanism is employed to establish positive stops at each end of the UHF television band and a U-shaped spring member is employed to establish separate detent positions for the selector shaft of the tuning mechanism while at the same time providing a biasing force for the cam follower arm of the counter stop mechanism.

It is a still further object of the present invention to provide a new and improved UHF tuning mechanism wherein the channel selector shaft is provided with an accurate detent position for each of the seventy UHF television stations and a simplified, concentric tens and units dial drive arrangement is provided.

It is a still further object of the present invention to provide a new and improved UHF tuner drive mechanism for a continuously variable UHF tuner which is effective to establish accurate detent positions for each of the seventy UHF television stations, is extremely compact, and may be manufactured at low cost on a mass production basis.

The invention, both as to its organization and method of operation, together with further objects and advantages thereof, will best be understood by reference to the following specification taken in connection with the accompanying drawings in which.

Figure 11:
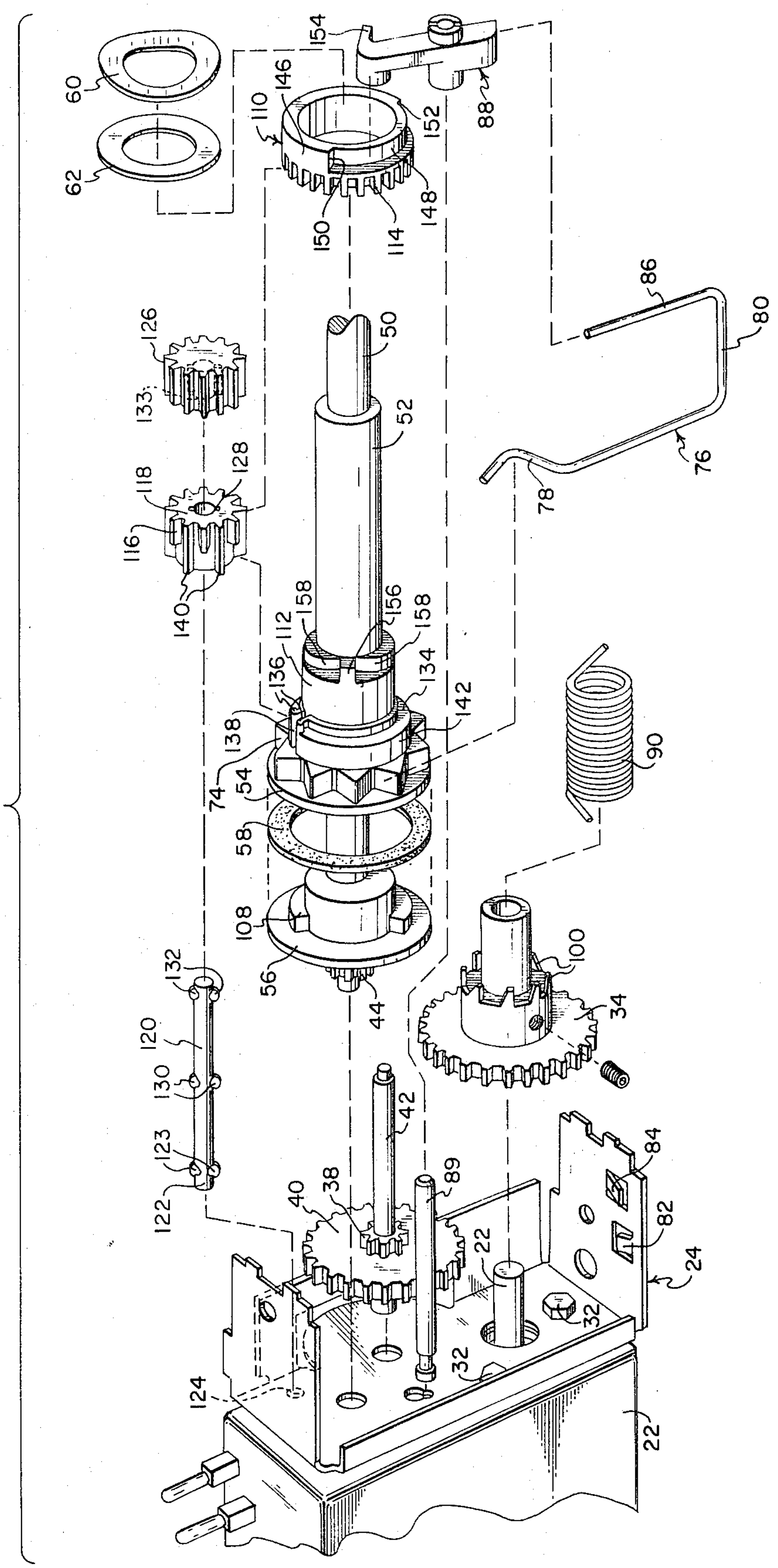
FIG. 11 is an exploded perspective view of a portion of the tuning drive mechanism of the tuner of FIG. 1.

Referring now to the drawings, the UHF tuning mechanism of the present invention is therein illustrated in conjunction with a UHF tuner 20 which is of the continuously variable type and is provided with a rotor shaft 22 rotation of which over an arc of approximately 180° is effective selectively to receive any one of the seventy UHF television stations. The rotor shaft gearing and counter-stop mechanism of the present invention is mounted within a two-piece bracket arrangement comprising a main rear bracket 24 and a forward bracket 26, these brackets being secured together by means of the screws 28. The UHF tuner 20 is solidly mounted to the rear wall of the bracket 24 through a monting plate 30 which is provided in the area of the rotor shaft 22, by means of the screws 32 (FIG. 11). It will be noted that the mechanism contained within the brackets 24 and 26 is extremely small and compact and is positioned in line with the UHF tuner 20 so that a very small silhouette or profile of the tuner and its drive mechanism is presented to the front panel of the associated television cabinet. Furthermore, the combined tuner and drive mechanism may be mounted at any angle by suitable connection to the front bracket 26 so that a wide variety of tuner locations and orientations within the cabinet is available.

A first plastic gear 34 is secured to the rotor shaft 22 by means of the set screw 36 and meshes with a small pinion gear 38 formed integrally with a larger gear 40, these gears also having an integral stub shaft portion 42 which is rotatably mounted in the brackets 24, 26. The gear 40 meshes with a small pinion gear 44 which is formed integrally with a hub member 46 which is press fitted onto the knurled end portion 48 of the central fine tuning shaft 50. The UHF channel selector shaft 52, which is journaled in a flange portion 26*a* of the front bracket 26 and which is concentric with the fine tuning shaft 50, has an enlarged rear flange portion 54 which is adapted to cooperate with an outer flange portion 56 of the hub 46 through a clutch friction pad 58. The members 54 and 56 are urged together by means of the bowed washer 60 which is positioned between the rear face of the bracket 26 and a flat washer 62 which engages a shoulder 64 formed in the selector shaft 52 so that the end portion 66 of the hub 46 is journaled in the opening formed by an annular flange portion 68 of the rear bracket 24. The selector shaft 52 is provided with a flat end portion 70 adapted to receive a combined units dial indicator and channel selector knob 72. The member 72 includes an integral disc portion 73 on which the ten units digits are imprinted in any suitable manner.

The portion 54 of the selector shaft 52 is provided with a series of ten detent lobes 74 and a U-shaped biasing spring indicated generally at 76 is provided with a V-shaped end portion 78 on one end thereof which is adapted to engage the facing shoulders of adjacent ones of the detent lobes 74 so as to establish 10 discrete detent positions for each full rotation of the selector shaft 52. The bight portion 80 of the U-shaped spring member 76 is restrained between tongue portions 82 and 84 which are struck out of the bracket 24 and the other end portion 86 of the spring 76 engages a stop lever 88 which is rotatably mounted on a shaft 89 extending between the brackets 24 and 26, the lever 88 forming a portion of the counter stop mechanism to be described in more detail hereinafter. As a result of the biasing force exerted on the detent lobes 74 by the spring 76, the selector shaft 52 is detented at ten discrete detent positions for each revolution thereof so that seven revolutions of the shaft 52 are required to cover the seventy UHF stations in the UHF television band. As the selector shaft 52 is rotated the hub member 46 is driven through the clutch pad 58 and the rotor shaft 22 is moved by the correct amount to select each UHF television station through the gears 44, 40 and 38, 34.

In order that the accurate detenting of the selector shaft 52 may be faithfully transmitted back to the rotor shaft 22, the gear pairs 44, 40 and 38, 34 are relatively loosely meshed and a loading coil spring 90 is provided at the rotor shaft end of this gear train. More specifically, one end of the coil spring 90 is positioned over an annular flange portion 92 (FIG. 4) formed in the bracket 26, one end 94 of the spring 90 being positioned beneath a tab portion 96 struck out of the bracket 26. The other end of the spring 90 is positioned within a recessed end portion of the hub 98 formed integrally with the gear 34 and the hub 98 is provided with a series of notches or teeth 100 which are adapted selectively to receive the other end of the coil spring 90. The spring 90 thus exerts a biasing force on the gear 34 so as to hold the gear train comprising the gears 34, 38 and 40, 44 constantly in mesh on one side of the gear teeth of the respective gears irrespective of the direction of rotation of the selector shaft 52, as described in more detail in said copending Valdettaro application Ser. No. 174,722. As a result, the detented positions of the selector shaft 52 are faithfully transmitted to the rotor shaft 22 so that accurate tuning to each UHF station is made possible. The positioning of the coil spring 90 in one of the notches 100 may be adjusted as desired to obtain the optimum biasing force for the rotor shaft 22 and its associated gear train.

In the event that a fine tuning operation is required at any particular UHF station position of the selector shaft 52, a fine tuning knob 102 which is provided on the end of the fine tuning shaft 50 may be rotated. When this occurs, the hub portion 46 rotates while the friction clutch, including the pad 58 and the flanges 54 and 56, slips since the flange 54 is held in the detented UHF position by the biasing spring end portion 78. Accordingly, when the shaft 50 is rotated, the gear 44 is rotated and provides a step-down input to the rotor shaft 22 so that this shaft is moved very slightly to perform a precise UHF fine tuning function.

In order to limit the amount of fine tuning range possible by rotation of the shaft 50, the flange portion 54 of the shaft 52 is provided with an annular recess 104 in the rear end thereof within which recess there is provided a lug portion 106. The hub portion 46 is provided with an arcuate shoulder portion 108 which is adapted to fit into the recess 104 and is of appropriate arcuate length to permit limited rotation of the shaft 50 with respect to the shaft 52. When the shaft 50 is rotated through an arc determined by the separation of the two ends of the shoulder 108, this shoulder engages the lug 106 and prevents further fine tuning movement of the shaft 50 in that direction.

Considering now the counter-stop mechanism referred to briefly heretofore, an annular arming cam member 110 is rotatably mounted on a portion 112 of the selector shaft 52 which is of intermediate diameter, the cam member 110 being provided with a series of gear teeth 114 which are in mesh with the short gear teeth 116 of a tripper gera member 118 which is mounted on a shaft 120 the rear end 122 of which is adapted to be seated in an opening 124 in the bracket 24. The shaft 120 is provided with flange lugs 123 adjacent the end 122 which prevent the shaft 120 from moving rearwardly and the forward end of the shaft 120 extends through the front bracket 26 and carries a tens dial pinion gear 126 on the forward end thereof. The tripper gear 118 is provided with a slotted opening 128 therein which is adapted to receive the flange lug portions 130 formed in the shaft 120 and the tens dial gear 126 is provided with a slotted opening 133 which extends partially through the gear 126 and cooperates with the flange lugs 132 on the forward end of the shaft 120 so that the gears 118 and 126 rotate together.

The arming cam member 110 is moved one step or increment for each revolution of the selector shaft 52 and controls the position of the stop lever 88 so that this lever is moved to an arming position adjacent each end of the UHF band. More particularly, the selector shaft 52 is provided with an annular groove or recess 134 (FIG. 11) which terminates in a pair of radially extending web portions 136; the space between the web portions 136 forming a deep groove 138 which is adapted to act as a one-toothed gear when it receives one of the long gear teeth 140 provided on the tripper cam 118, the long gear teeth 140 being extensions of every alternate one of the short gear teeth 116. A pair of adjacent ones of the long gear teeth 140 of the tripper gear 118 normally ride on the annular peripheral portion 142 of the selector shaft 52. However, when the web portions 136 are moved into engagement with one of the short gear teeth 116, the tripper gear 118 is moved one increment so that the next adjacent pair of long teeth 140 are in engagement with the annular surface 142, one of the teeth 140 entering the groove 138 as this movement of the gear 116 is accomplished. The arming cam member 110 is thus rotated one increment for each full revolution of the selector shaft 52 and remains in the incremented position during the succeeding revolution of the shaft 52 because the long gear teeth 140 ride on the annular surface 142. The shaft 120 is thus restrained at different incremental positions corresponding to the tens digit of the channel number of the received UHF stations.

The stop lever 88 is provided with an arming lobe portion 144 which noramlly rides on the outer peripheral portion 146 of the arming cam member 110. However, the peripheral portion 146 does not extend completely around the cam member 110 since the member 110 is provided with an arcuate portion 148 of reduced radius defined by the shoulders 150 and 152. The stop lever 88 is also provided with a stop lobe 154 which is somewhat longer than the arming lobe 144 and is positioned in alignment with a stop lug 156 formed in the selector shaft 52.

Figures 1, 2, 3, 4, 6, 7, 8, 9, 10:
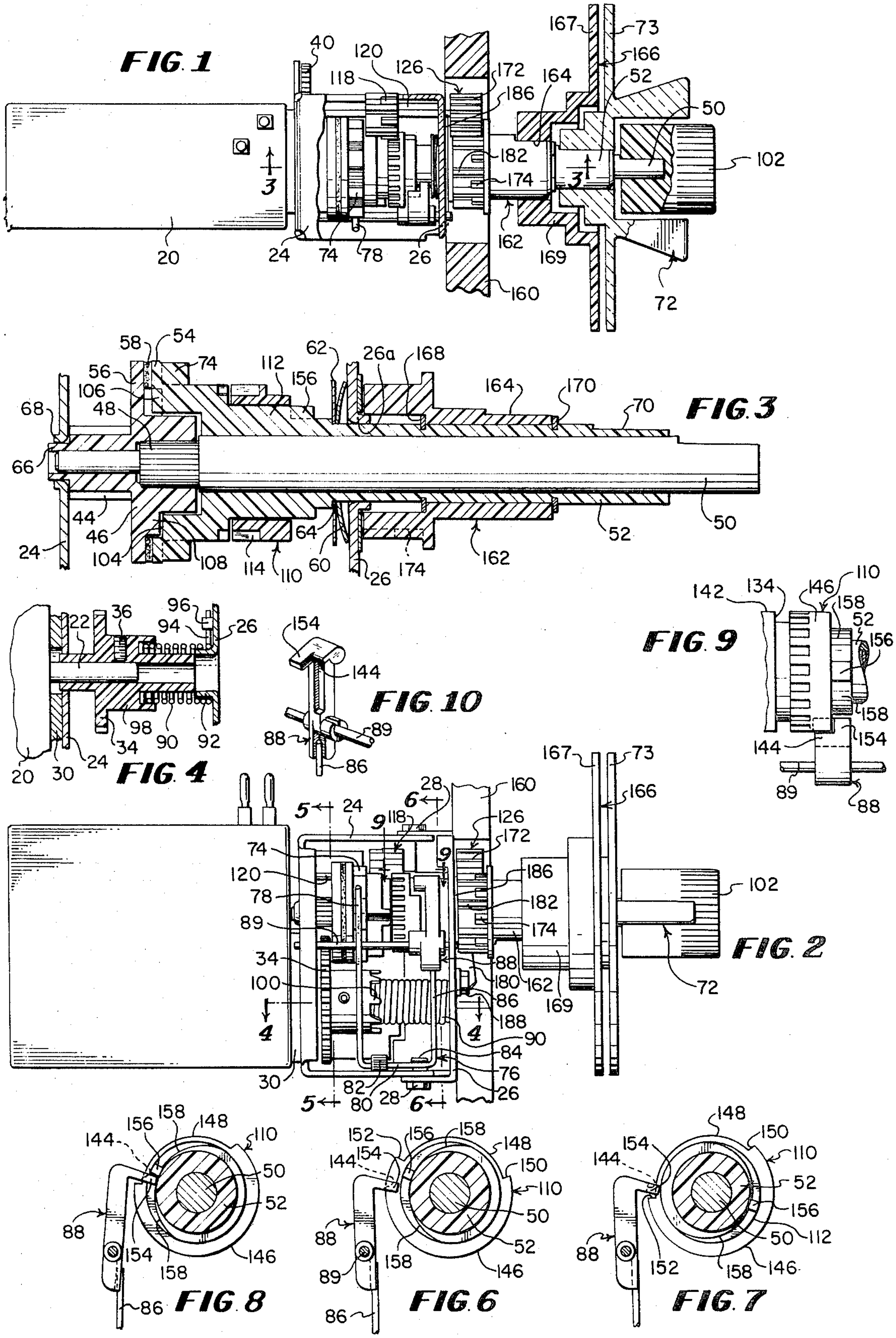
FIG. 1 is a top plan view of a UHF tuner drive mechanism embodying the features of the present invention.
FIG. 2 is a front view of the tuner drive mechanism of FIG. 1.
FIG. 3 is a fragmentary sectional view taken along the line 3—3 of FIG. 1 and shown on a somewhat enlarged scale with the television cabinet front panel and control knobs removed.
FIG. 4 is a sectional view taken along the line 4—4 of FIG. 2.
FIG. 6 is a sectional view taken along the line 6—6 of FIG. 2.
FIGS. 7 and 8 are views similar to FIG. 6 but showing the counter stop mechanism in different positions.
FIG. 9 is a sectional view taken along the lines 9—9 of FIG. 2.
FIG. 10 is a perspective view of the stop lever portion of the counter mechanism in the tuner of FIG. 1.
Figure 12:
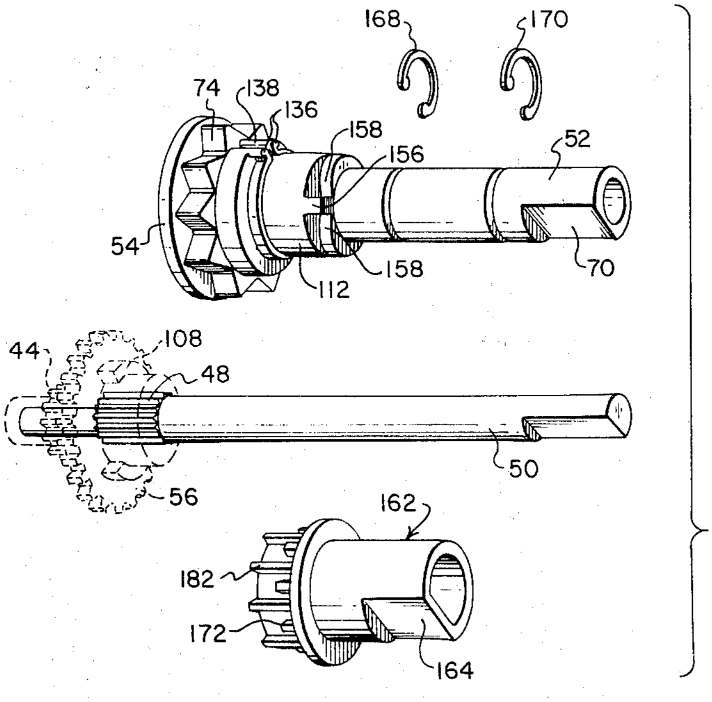
FIG. 12 is an exploded perspective view of the drive shaft arrangement of the tuner of FIG. 1.
Figure 5:
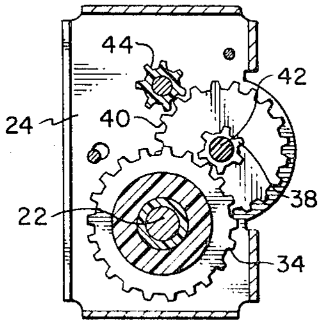
FIG. 5 is a cross-sectional view taken along the line 5—5 of FIG. 2.

During periods when the arming lobe 144 rides on the periphery 146 of the camming member 110, the stop lobe 154 does not extend downwardly by an amount sufficient to engage the lug 156 or the camming surfaces 158 formed in the selector shaft 52 on each side of the stop lug 156. This condition is shown in FIG. 6 wherein it will be seen that the stop lobe 154 normally rides above the end of the stop lug 156 and the adjacent camming surfaces 158 when the arming lobe portion 144 rides on the periphery 146 of the arming cam member 110. However, when the arming cam 110 is moved by the tripper gear 118 to the position shown in FIG. 7, i.e., near one end of the television band, the arming lobe 144 is moved off of the shoulder 152 and the stop lobe 154 of the lever 88 is urged into engagement with the portion 112 of the selector shaft 52 at a point intermediate the camming surfaces 158 due to the biasing force of the spring arm portion 86. As the selector shaft 52 is rotated the last five detent positions to the position shown in FIG. 8 of the drawings, the stop lobe 154 rides inwardly along the cam surface 158 so that when an attempt is made to rotate the selector shaft 52 further in the counter-clockwise direction from the position shown in FIG. 8, the stop lug 156 is moved into engagement with the stop lobe 154 and further movement of the selector shaft in this direction is positively prevented. In this connection it will be noted that the spring arm 86 continues to urge the stop lobe 154 into engagement with the cam surface 158 to provide a positive stop action and prevent further movement of the selector shaft 52 in the counterclockwise direction.

A similar action occurs near the other end of the UHF band when the arming lobe 144 is moved off of the shoulder 150 and thereafter permits the stop lobe 154 to ride inwardly along the cam surface 158 on the other side of the stop lug 156 as the selector shaft is moved the last two detent positions to the other end of the UHF band. As a result positive limiting or stop action of the selector shaft 52 is provided in both directions at each end of the seven revolutions of movement of the shaft 52 required to cover the entire UHF television band.

When the selector shaft is moved away from the stop position at the end of the UHF band shown in FIG. 8, the stop lobe 154 rides outwardly along the camming surface 158 and as the arming lobe 144 strikes the shoulder 152 the stop lever 88 is cammed outwardly slightly to the position shown in FIG. 6 in which position the stop lobe 154 is positioned outside the path of the stop lug 156. The selector shaft 152 is thereafter permitted to be rotated approximately seven revolutions in the clockwise direction before the above-described stop action is provided at the other end of the UHF band.

It will be noted that the U-shaped spring member 76 has the configuration shown in FIG. 11 when unstressed and the intermediate portion 80 of this spring is twisted when the spring is installed so that a substantial biasing force is obtained. Furthermore, the forces developed by the ends 78 and 86 of this spring are applied to the same side of the selector shaft - fine tuning shaft combination so that these shafts are not twisted in the journals **26*a* and 68. More particularly, the end portion 78 of the spring 76 exerts a sidewise force on the detent lobe portion 74 of the selector shaft 52 and the end 86 of the spring 76 biases the stop lever so that the lobes 144 or 154 thereof also exert a sidewise force on the arming cam member 110 or on the selector shaft 52 directly which is in the same direction as the force exerted by the end portion 78. As a result, the selector shaft 52 is held firmly against the journal 26*a* and the fine tuning shaft 50 is held firmly against the journal 68** without producing any twisting action on these shafts which would tend to prevent the accurate positioning of these shafts to different detented positions.

In accordance with a further feature of the invention, the above-described counter stop mechanism is also employed as a drive source for the tens digit indicator dial of a composite dial indicator arrangement which indicates the exact UHF channel to which the UHF is tuned. More specifically, a tens dial sleeve indicated generally at 162 is rotatably mounted on the selector shaft 52 ahead of the bracket 26 and projects through the front panel 160 of the associated television receiver cabinet. The sleeve 162 is provided with a flat 164 for registering a tens digit indicator dial indicated generally at 166. The dial 166 has a disc portion 167 on which tens digits corresponding to the UHF channel members are imprinted in any suitable manner, these digits being positioned so that they form a composite dial with the units disc 73, as described in detail in said Valdettaro application Ser. No. 174,722, and a hub portion 169 which is slipped over the selector shaft 52 and positioned on the sleeve 162 after the tuning mechanism has been assembled into the receiver cabinet. The tens dial sleeve 162 is positioned on the selector shaft 52 by means of a pair of C-washers 168 and 170 which slip into corresponding grooves in the shaft 52, the C-washer 168 being first assembled onto the shaft 52, the sleeve 162 then being inserted over the shaft 52 and the washer 170 then being slipped in place.

As described generally heretofore, a tens dial driving gear 126 is mounted on the shaft 120 outboard of the bracket 26 and rotates in increments with the gear 118 as this gear is rotated one tens digit increment for each revolution of the selector shaft 52 by the above-described operation of the one tooth gear portions 136. The gear 126 is provided with teeth 172 which are in mesh with relatively short gear teeth 174 provided on the tens dial sleeve 162. Accordingly, as the driving gear 172 is rotated each tens digit increment, the sleeve 162, and the tens digit dial 166 secured thereto, is rotated one tens digit increment so as to provide the desired tens digit movement of the composite dial indicator arrangement. If desired, an additional detent member in the form of a flat spring arm 180 may be provided with a V-shaped end portion adapted to engage a pair of adjacent ones of the long gear teeth 182 on the sleeve 162 to provide an additional detent action for the tens dial sleeve 162, the teeth 182 being extensions of alternate ones of the teeth 174 on the sleeve 162. The spring arm 180 is provided with a right angle portion 186 which is mounted on the bracket 26 by means of the screw 188.

In the embodiment of FIGS. 1 to 12 the tens dial 167 and units dial 73 are positioned outside of the front panel 160 of the television receiver cabinet and any suitable arrangement may be employed to facilitate reading of the composite digits of these dials, as described in detail in said copending Valdettaro application Ser. No. 174,722. For example, a stationary masking member may be provided behind the tens dial 167, or, in the alternative, illumination by means of a suitable pilot light may be provided through an opening in the front panel 160 of the television cabinet.

Figure 13:
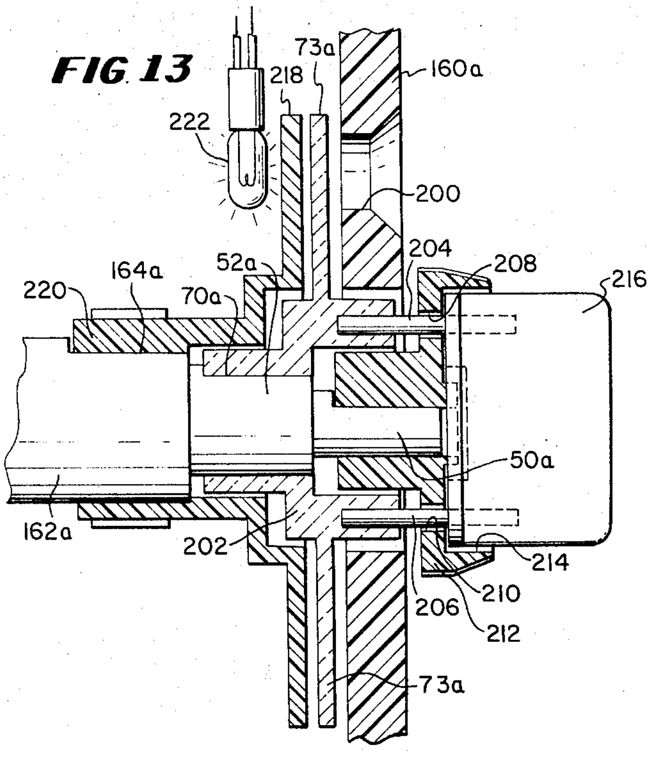
FIG. 13 is a sectional side view of an alternative embodiment of the invention wherein the fine tuning knob is positioned outside the UHF station selector shaft.
Figure 14:
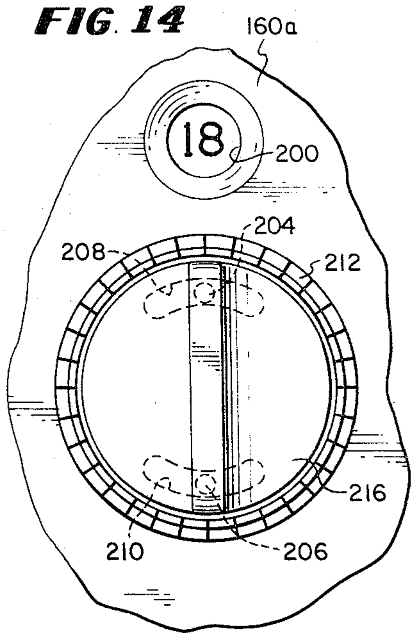
FIG. 14 is a front view of the embodiment of FIG. 13.

In accordance with a further aspect of the present invention, the above-described counter-stop mechanism may be employed with a selector knob and fine tuning knob arrangement which is similar to the conventional VHF television tuner in which the fine tuning knob is positioned outside of the selector knob. More particularly, referring to the arrangement shown in FIGS. 13 and 14, a selector shaft **52*a* is employed which is similar to the selector shaft 52 but is of shorter length and terminates behind the front panel 160*a* of a television receiver which is provided with a viewing aperture 200. A units digit disc 73*a* is provided with a hub portion 202 which is adapted to be positioned on the flat 70*a* of the selector shaft 52*a*, the hub 202 having a pair of opposed apertures in the forward edge thereof in which a pair of pins 204 and 206 are positioned. The pins 204 and 206 extend through arcuate openings 208 and 210 in a fine tuning knob 212 which is positioned on the end of the fine tuning shaft 50*a*. The knob 212 is provided with a recess 214 adapted to receive a selector knob 216 which is secured to and supported by the pins 204 and 206. A tens digit disc 218 is provided with a hub portion 220 which is positioned on the flat portion 164*a* of the tens dial sleeve 162*a*, other portions of the UHF tuning mechanism being identical to the embodiment of FIGS. 1 to 12, inclusive, described in detail heretofore. The discs 73*a* and 218 which are positioned behind the panel 160*a*, are provided with suitable units and tens digits which may be viewed through the opening 200 and illuminated by the pilot light 222**.

When the selector knob 216 is rotated to select different UHF stations the fine tuning knob 212 rotates therewith since the clutch 54, 56, 58 does not slip. However, when a fine tuning operation is to be performed at a particular UHF station, the fine tuning knob is rotated independently of the knob 216 to the extent of the arcuate openings 208, 210 in the knob 216 while the selector shaft **52*a* remains fixed and the clutch 54, 56, 58** slips.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. The combination of, a UHF tuner having a continuously variable main tuning shaft rotation of which is effective selectively to receive signals from all television stations in the UHF television band, a selector shaft, means for establishing a plurality of equally spaced detent positions for said selector shaft so that all of the stations in said UHF band are covered by rotating said selector shaft more than one revolution, gear means interconnecting said selector shaft and said main tuning shaft, means connected to said selector shaft and defining a limit stop, an arming cam member, means for rotating said cam member a predetermined amount for each revolution of said selector shaft, a stop member having a first portion adapted to engage said cam member and a second portion adapted to engage said limit stop, and means for biasing said first portion of said stop member into engagement with said cam member, said cam member having a first area in which said second portion of said stop member is held out of engagement with said limit stop as said selector shaft is rotated and a second area in which said second portion of said stop member is positioned to engage said limit stop.

2. The combination of claim 1, wherein said cam member is provided with two arming areas in one of which said second portion of said stop member is positioned to engage one side of said limit stop and in the other of which said second portion of said stop member is positioned to engage the other side of said limit stop.

3. The combination of claim 1, wherein said means for rotating said cam member comprises a single tooth gear rotatable with said selector shaft, gear means carried by said cam member, and a pinion mounted for rotation independently of said cam member and said selector shaft.

4. The combination of claim 3, wherein said pinion has a first set of teeth one of which is engaged by said single tooth gear as said seletor shaft is rotated, and a second set of teeth continuously in mesh with said gear means, whereby said cam member is rotated a predetermined amount for each revolution of said selector shaft.

5. The combination of claim 4, which includes a second pinion mounted for rotation with said first named pinion, a second gear concentric with said selector shaft and driven by said second pinion, tens digit indicating means rotatable with said second gear, and units digit indicating means rotatable with said shaft, said shaft,said tens and units digit indicating means providing a composite indication of the channel number corresponding to each UHF station position of said main tuning shaft.

6. The combination of claim 1, wherein said detent means comprises a detent wheel rotatable with said selector shaft, and said biasing means comprises a U-shaped spring member having one end portion in engagement with said detent wheel to establish said equally spaced detent positions of said selector shaft, the other end of said spring member engaging said stop member to bias the same into engagement with said cam member.

7. The combination of claim 6, which includes a housing for said selector shaft having spaced apart bearing means, said selector shaft being held against said bearing means by said U-shaped spring member.

8. The combination of claim 7, wherein said U-shaped spring member is positioned so that said end portions exert side thrust on said selector shaft in the same direction at two points spaced along the length of said selector shaft, thereby accurately to hold said selector shaft against said bearing means without twisting said selector shaft.

9. In a UHF tuner of the type having a continuously variable main tuning shaft rotation of which is effective selectively to receive signals from all television stations in the UHF television band, the combination of a pair of spaced apart walls extending perpendicularly of said main tuning shaft, a selector shaft positioned in offset relation to said main tuning shaft and extending parallel thereto, a fine tuning shaft positioned inside said selector shaft and extending beyond the rear end thereof, means for mounting the rear end of said fine tuning shaft in the rearmost one of said pair of walls, means for mounting an intermediate portion of said selector shaft in the forward one of said pair of walls, gear means interconnecting the rear end of said fine tuning shaft with said main tuning shaft, clutch means positioned between said pair of walls and interconnecting said selector shaft and said fine tuning shaft, and detent means for said selector shaft to establish a series of equally spaced detent positions for said selector shaft so that all of the stations in said UHF band are covered by rotating said selector shaft more than one revolution.

10. The combination of claim 9 which includes a control member concentric with said selector shaft and positioned between said pair of walls, means including means carried by said selector shaft for rotating said control member a predetermined increment for each revolution of said selector shaft, and limit stop means cooperating with said control member and providing a positive stop for said selector shaft at positions corresponding to each end of said UHF band.

11. The combination of claim 10, which includes a tens dial sleeve rotatably mounted on said selector shaft forwardly of said forward wall, and gear means interconnecting said control member and said tens dial sleeve so that said sleeve is moved in increments corresponding to the incremental movement of said control member.

12. The combination of claim 11, in which said gear means comrises a first gear on said control member, a control shaft mounted between said pair of walls and extending forwardly of said forward wall, a second gear mounted on said control shaft and in mesh with said first gear, a third gear mounted on said forwardly extending portion of said control shaft, and a fourth gear on said tens dial sleeve and in mesh with said third gear.

* * * * *